(12) United States Patent
Hu et al.

(10) Patent No.: US 11,614,416 B2
(45) Date of Patent: Mar. 28, 2023

(54) SYSTEM AND METHOD FOR ALIGNING ELECTRON BEAMS IN MULTI-BEAM INSPECTION APPARATUS

(71) Applicant: ASML Netherlands B.V., Veldhoven (NL)

(72) Inventors: Xuerang Hu, San Jose, CA (US);
Xinan Luo, San Jose, CA (US);
Qingpo Xi, Fremont, CA (US);
Xuedong Liu, San Jose, CA (US);
Weiming Ren, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 25 days.

(21) Appl. No.: 16/655,140

(22) Filed: Oct. 16, 2019

(65) Prior Publication Data
US 2020/0124546 A1 Apr. 23, 2020

Related U.S. Application Data

(60) Provisional application No. 62/748,251, filed on Oct. 19, 2018.

(51) Int. Cl.
*G01N 23/225* (2018.01)
*G01N 21/95* (2006.01)
(Continued)

(52) U.S. Cl.
CPC ....... *G01N 23/225* (2013.01); *G01N 21/9501* (2013.01); *H01J 37/244* (2013.01);
(Continued)

(58) Field of Classification Search
CPC . G01N 23/225; G01N 21/9501; H01J 37/244; H01J 37/32321; H01J 2237/082; H01J 2237/2806; H01J 2237/2817
(Continued)

(56) References Cited

U.S. PATENT DOCUMENTS 5,900,629 A * 5/1999 Todokoro .............. H01J 37/268
250/397
7,964,846 B2 * 6/2011 Mooney ................ H01J 37/244
250/311
(Continued)

FOREIGN PATENT DOCUMENTS

TW 201820407 A 6/2018
WO WO 2018/145983 A1 8/2018
WO WO 2018/172186 A1 9/2018

OTHER PUBLICATIONS

Taiwanese Office Action issued in related Taiwanese Patent Application No. 108136520, dated Jun. 23, 2020 (14 pgs.).
(Continued)

*Primary Examiner* — Wyatt A Stoffa
(74) *Attorney, Agent, or Firm* — Finnegan, Henderson, Farabow, Garrett & Dunner, LLP

(57) ABSTRACT

An improved charged particle beam inspection apparatus, and more particularly, a particle beam inspection apparatus including an improved alignment mechanism is disclosed. An improved charged particle beam inspection apparatus may include a second electron detection device to generate one or more images of one or more beam spots of the plurality of secondary electron beams during the alignment mode. The beam spot image may be used to determine the alignment characteristics of one or more of the plurality of secondary electron beams and adjust a configuration of a secondary electron projection system.

15 Claims, 15 Drawing Sheets

(51) Int. Cl.
  *H01J 37/244* (2006.01)
  *H01J 37/32* (2006.01)
(52) U.S. Cl.
  CPC ... *H01J 37/32321* (2013.01); *H01J 2237/082* (2013.01); *H01J 2237/2806* (2013.01); *H01J 2237/2817* (2013.01)
(58) Field of Classification Search
  USPC .......................................................... 250/310
  See application file for complete search history.

(56) References Cited

U.S. PATENT DOCUMENTS

| | | | | |
|---|---|---|---|---|
| 8,624,186 B2* | 1/2014 | Wang | ............... | H01J 37/28 250/397 |
| 10,629,406 B2* | 4/2020 | Ogasawara | ........... | H01J 37/045 |
| 10,937,627 B2* | 3/2021 | Stejskal | ................ | H01J 37/244 |
| 2002/0148961 A1 | 10/2002 | Nakasuji et al. | | |
| 2009/0001267 A1 | 1/2009 | Enyama et al. | | |
| 2010/0032576 A1* | 2/2010 | Mooney | ................ | H01J 37/16 250/361 R |
| 2015/0348742 A1* | 12/2015 | Albiez | ................ | H01J 37/18 250/441.11 |
| 2016/0284505 A1 | 9/2016 | Ren et al. | | |
| 2016/0329186 A1* | 11/2016 | Li | ............ | H01J 37/28 |
| 2019/0051487 A1* | 2/2019 | Ogasawara | ........... | H01J 37/3177 |
| 2019/0378681 A1* | 12/2019 | Stejskal | ................ | H01J 37/244 |
| 2021/0210306 A1* | 7/2021 | Zeidler | ................ | H01J 37/244 |
| 2021/0384007 A1* | 12/2021 | Yamamoto | ............ | H01J 37/244 |

OTHER PUBLICATIONS

International Search Report issued in related International Application No. PCT/EP2019/075316, dated Dec. 20, 2019 (3 pgs.).
Krivanek, O.L. et al.; "Applications of slow-scan CCD cameras in transmission electron microscopy"; Ultramicroscopy, vol. 49, Issues 1-4, pp. 95-108, Feb. 1993 (14 pgs.).
Jin, L.; "Direct Electron Detection in Transmission Electron Microscopy"; A dissertation submitted in partial satisfaction of the requirements for the degree Doctor of Philosophy in Physics at University of California, San Diego, 2009 (172 pgs.).
Enyama, M. at al., "Optical system for a multiple-beam scanning electron microscope"; J. Vac. Sci. Technol. B 32(5), Sep./Oct. 2014 (7 pgs.).

* cited by examiner

SYSTEM AND METHOD FOR ALIGNING ELECTRON BEAMS IN MULTI-BEAM INSPECTION APPARATUS

CROSS-REFERENCE TO RELATED APPLICATIONS

This application claims priority of U.S. application 62/748,251, which was filed on Oct. 19, 2018, and which is incorporated herein by reference in its entirety.

FIELD

The embodiments provided herein disclose a particle beam inspection apparatus, and more particularly, a particle beam inspection apparatus including an improved alignment mechanism.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the sample. By scanning the probe spot over the sample surface and collecting the secondary electrons, pattern inspection tools may obtain an image of the sample surface.

SUMMARY

The embodiments provided herein disclose a particle beam inspection apparatus, and more particularly, a particle beam inspection apparatus including an improved alignment mechanism.

In some embodiments, the charged particle beam apparatus for inspecting a wafer may include a first electron detection device and a second electron detection device. The first electron detection device may detect a plurality of secondary electron beams for inspection of the wafer. The second electron detection device may generate one or more images of one or more beam spots of the plurality of secondary electron beams and may be configured to be used to determine an alignment characteristic associated with the first electron detection device.

In some embodiments, a method of inspecting a wafer using the charged particle beam system is provided. The charged particle system may include a secondary projection system to project a plurality of secondary electron beams onto a detection surface of a first electron detection device. The method may include generating one or more images of one or more beam spots of the plurality of secondary electron beams using a second electron detection device. The method may also include determining an alignment characteristic associated with the first electron detection device based on the one or more images of the one or more beam spots of the plurality of secondary electron beams.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1A:
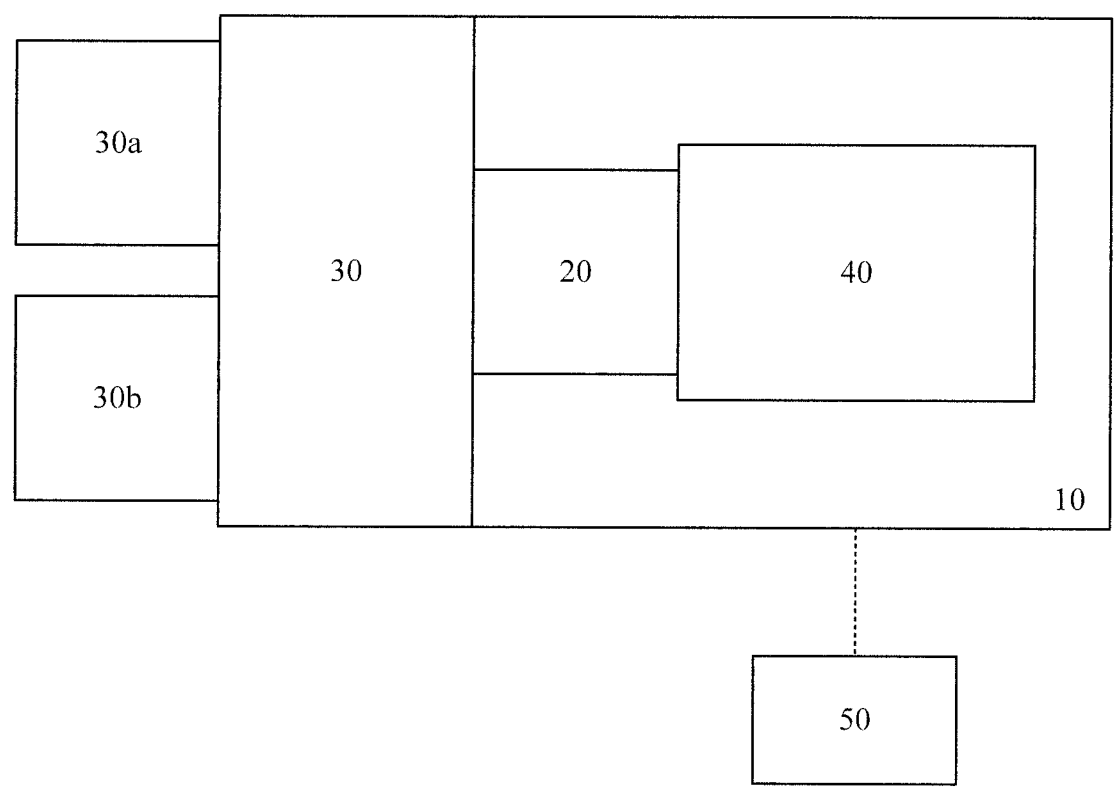
FIG. 1A is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process yield is desirable in an IC chip manufacturing facility, maintaining a high wafer throughput, defined as the number of wafers processed per hour, is also essential. High process yield and high wafer throughput can be impacted by the presence of defects, especially if operator intervention is required for reviewing the defects. Thus, high throughput detection and identification of micro and nano-sized defects by inspection tools (such as a SEM) is essential for maintaining high yield and low cost.

A SEM scans the surface of a wafer with a focused beam of electrons. The electrons interact with the wafer and generate secondary electrons. By scanning the wafer with an electron beam and capturing the secondary electrons with a detector, a SEM creates an image of the wafer that shows the internal device structure in the area of the wafer being inspected.

For high throughput inspection, some of the newer inspection systems use multiple electron beams. As multiple electron beams can scan different parts of wafer at the same time, multi-beam electron inspection system can inspect a wafer at much higher speed than a single-beam system. However, a conventional multi-beam inspection system can suffer low inspection accuracy due to the cross-talk between adjacent electron beams. One of the main sources of the cross-talk is misalignments among different parts of the inspection systems with respect to the paths that the electron beams travel. For example, a detector capturing the secondary electron beams should be properly aligned with lenses that control the alignment characteristics (such as focusing and positions) of secondary electron beams associated with the detector; otherwise, a secondary electron beam can interfere with the detection of an adjacent secondary electron beam.

One aspect of the present disclosure includes an electron beam image viewer that can produce images of the multiple secondary electron beams. These images can be used to determine how well the electron optical elements (such as lenses, beam separator and the electron detector) in the inspection system are aligned, and determine whether any adjustment to one or more of the electron optical elements is required. The images can further be used to determine a quality of focus of the secondary electron beams, such as whether the secondary electron beams will form spots on the detectors of the desired size, shape, position, etc., and determine whether any adjustment is required. These determinations or adjustments can be conducted by a computer inside of the multi-beam inspection system or can be done by an operator who can visually inspect the images of secondary electron beams.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference is now made to FIG. 1A, which is a schematic diagram illustrating an exemplary charged particle beam inspection system 100, consistent with embodiments of the present disclosure. As shown in FIG. 1A, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam electron inspection tool. In other embodiments, electron beam tool 40 may comprise a multi-beam electron inspection tool.

A controller 50 is electronically connected to electron beam tool 40. Controller 50 may be a computer configured to execute various controls of charged particle beam inspection system 100. Controller 50 may also include a processing circuitry configured to execute various signal and image processing functions. While controller 50 is shown in FIG. 1A as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 1B:
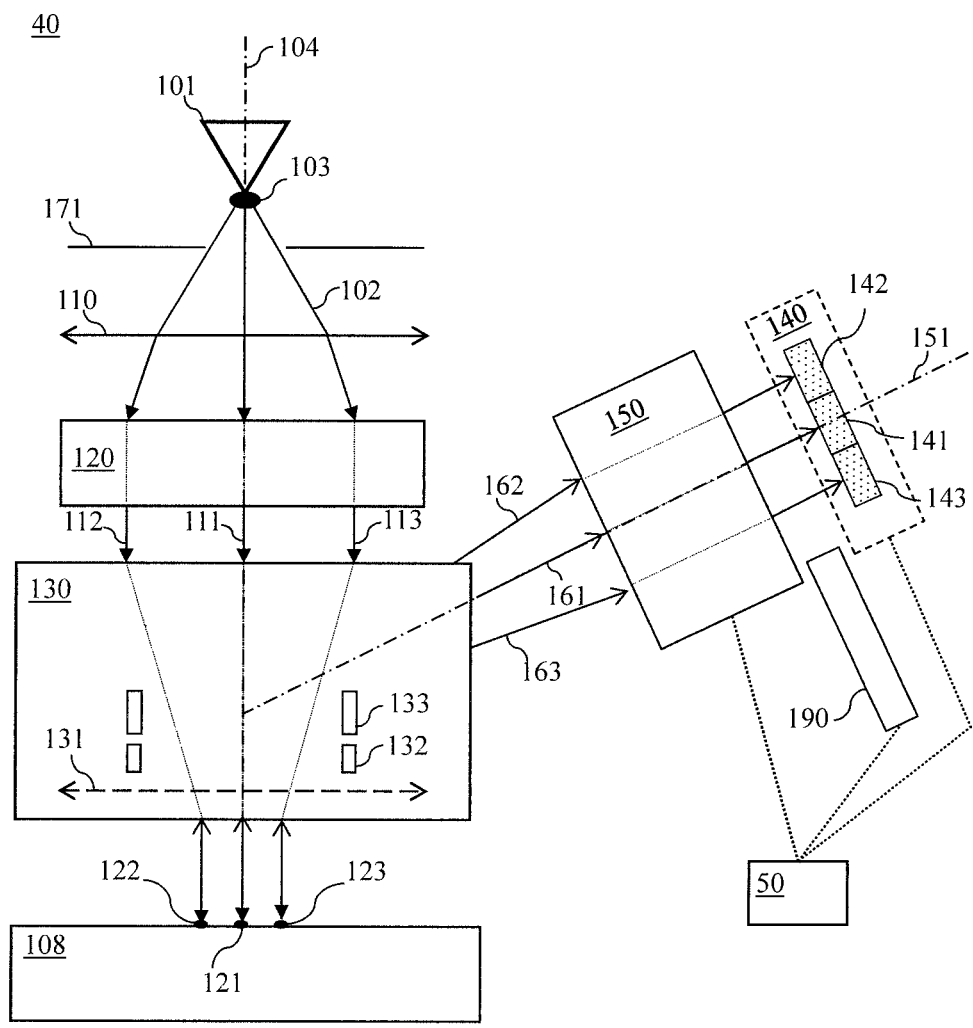
FIG. 1B is a schematic diagram illustrating an exemplary electron beam tool, consistent with embodiments of the present disclosure.

Reference is now made to FIG. 1B, which is a schematic diagram illustrating an exemplary electron beam tool 40 including a multi-beam electron inspection tool that is part of the exemplary charged particle beam inspection system 100 of FIG. 1A, consistent with embodiments of the present disclosure. Multi-beam electron beam tool 40 (also referred to herein as apparatus 40) comprises an electron source 101, a gun aperture plate 171, a condenser lens 110, a source conversion unit 120, a primary projection optical system 130, a sample 108, a secondary projection system 150, a first electron detection device 140, and a second electron detection device 190. Primary projection optical system 130 may comprise an objective lens 131. Electron detection device 140 may comprise a plurality of detection elements 141, 142, and 143. A beam separator 133 and a deflection scanning unit 132 may be positioned inside primary projection optical system 130.

Electron source 101, gun aperture plate 171, condenser lens 110, source conversion unit 120, beam separator 133, deflection scanning unit 132, and primary projection optical system 130 may be aligned with a primary optical axis 104 of apparatus 40. Secondary projection system 150 and electron detection device 140 may be aligned with a secondary optical axis 151 of apparatus 40.

Electron source 101 may comprise a cathode (not shown) and an extractor or anode (not shown), in which, during operation, electron source 101 is configured to emit primary electrons from the cathode and the primary electrons are extracted or accelerated by the extractor and/or the anode to form a primary electron beam 102 that forms a primary beam crossover (virtual or real) 103. Primary electron beam 102 may be visualized as being emitted from primary beam crossover 103.

Source conversion unit 120 may comprise an image-forming element array (not shown), a field curvature compensator array (not shown), an astigmatism compensator array (not shown), and a beam-limit aperture array (not shown). The image-forming element array may comprise a plurality of micro-deflectors or micro-lenses to influence a plurality of primary beamlets 111, 112, 113 of primary electron beam 102 and to form a plurality of parallel images (virtual or real) of primary beam crossover 103, one for each of the primary beamlets 111, 112, and 113. The field curvature compensator array may comprise a plurality of micro-lenses to compensate field curvature aberrations of the primary beamlets 111, 112, and 113. The astigmatism compensator array may comprise a plurality of micro-stigmators to compensate astigmatism aberrations of the primary beamlets 111, 112, and 113. The beam-limit aperture array may be configured to limit diameters of individual primary beamlets 111, 112, and 113. FIG. 1B shows three primary beamlets 111, 112, and 113 as an example, and it is appreciated that source conversion unit 120 may be configured to form any number of primary beamlets. Controller 50 may be connected to various parts of charged particle beam inspection system 100 of FIG. 1A, such as first electron detection device 140, secondary electron detection device 190, or secondary projection system 150. In some embodiments, as explained in further details below, controller 50 may perform various image and signal processing functions. Controller 50 may also generate various control signals to govern operations of charged particle beam inspection system 100.

Condenser lens 110 is configured to focus primary electron beam 102. Condenser lens 110 may further be configured to adjust electric currents of primary beamlets 111, 112, and 113 downstream of source conversion unit 120 by varying the focusing power of condenser lens 110. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 110. Condenser lens 110 may be a movable condenser lens that may be configured so that the position of its first principle plane is movable. The movable condenser lens may be configured to be magnetic, which may result in off-axis beamlets 112 and 113 landing on a beamlet-limit mechanism with rotation angles. The rotation angles change with the focusing power and the position of the first principal plane of the movable condenser lens. In some embodiments, the movable condenser lens may be a movable anti-rotation condenser lens, which involves an anti-rotation lens with a movable first principal plane.

Objective lens 131 may be configured to focus beamlets 111, 112, and 113 onto a sample 108 for inspection and may form, in the current embodiments, three probe spots 121, 122, and 123 on the surface of sample 108. Gun aperture plate 171, in operation, is configured to block off peripheral electrons of primary electron beam 102 to reduce Coulomb effect. The Coulomb effect may enlarge the size of each of probe spots 121, 122, and 123 of primary beamlets 111, 112, 113, and therefore deteriorate inspection resolution.

Beam separator 133 may, for example, be a Wien filter comprising an electrostatic deflector generating an electrostatic dipole field and a magnetic dipole field (not shown in FIG. 1B). In operation, beam separator 133 may be configured to exert an electrostatic force by electrostatic dipole field on individual electrons of primary beamlets 111, 112, and 113. The electrostatic force is equal in magnitude but opposite in direction to the magnetic force exerted by magnetic dipole field of beam separator 133 on the individual electrons. Primary beamlets 111, 112, and 113 may therefore pass at least substantially straight through beam separator 133 with at least substantially zero deflection angles.

Deflection scanning unit 132, in operation, is configured to deflect primary beamlets 111, 112, and 113 to scan probe spots 121, 122, and 123 across individual scanning areas in a section of the surface of sample 108. In response to incidence of primary beamlets 111, 112, and 113 at probe spots 121, 122, and 123, electrons emerge from sample 108 and generate three secondary electron beams 161, 162, and 163. Each of secondary electron beams 161, 162, and 163 typically comprise electrons having different energies including secondary electrons (having electron energy ≤50 eV) and backscattered electrons (having electron energy between 50 eV and the landing energy of primary beamlets 111, 112, and 113). Beam separator 133 is configured to deflect secondary electron beams 161, 162, and 163 towards secondary projection system 150. Secondary projection system 150 subsequently focuses secondary electron beams 161, 162, and 163 onto detection elements 141, 142, and 143 of electron detection device 140. Detection elements 141, 142, and 143 are arranged to detect corresponding secondary electron beams 161, 162, and 163 and generate corresponding signals which are sent to signal processing system (not shown), e.g. to construct images of the corresponding scanned areas of sample 108.

In some embodiments, detection elements 141, 142, and 143 detect corresponding secondary electron beams 161, 162, and 163, respectively, and generate corresponding intensity signal outputs (not shown) to an image processing system (e.g., controller 50). In some embodiments, each detection element 141, 142, and 143 may comprise one or more pixels. The intensity signal output of a detection element may be a sum of signals generated by all the pixels within the detection element.

For a multi-beam system, cross-talk in the output signals from adjacent beams may be caused by the effects of aberration in secondary projection system 150 or deflection accuracy of secondary electron beams in beam separator 133. Multiple factors may cause the aberration or dispersion. For example, beam separator 133, which changes the direction of secondary electron beams towards a detector, may deflect secondary electron beams 161, 162, and 163 in inaccurate angles. Also, electron detection device 140 or secondary projection system 150 may be improperly aligned with secondary optical axis 151. When these misalignments exist, secondary electron beams 161, 162, and 163 may suffer unwanted aberrations, magnification errors, or rotation angle errors, thereby resulting in malformed shape, position, or excessive enlargements or beam spots, which in turn may cause overlaps and cross-talk between adjacent beams. Therefore, in a multi-beam wafer inspection system, such as multi-beam electron beam tool 40 shown in FIG. 1B, reducing these misalignments is important to obtain accurate reconstruction of images of a sample (e.g., wafer) for inspection.

In some embodiments, an electron image viewer, such as second electron detection device 190, may be used to examine the shapes and positions of secondary electron beam spots and determine alignment characteristics of secondary electron beams, such as whether misalignments exist in the secondary electron projection path (including beam separator 133 and secondary projection system 150) and by how much, or whether the secondary electron beams are sufficiently focused to form the desired beam spot sizes, shapes, positions, etc.

In some embodiments, multi-beam electron beam tool 40 may implement two different operating modes, such as an inspection mode and an alignment mode. During the inspection mode, secondary electron beams 161, 162, and 163 may be directed to first electron detection device 140, which then generates image signals based on the received secondary electron beams. And then, controller 50 may produce images of sample 108 based on the image signals from first electron detection device 140.

During the alignment mode, secondary electron beams 161, 162, and 163 may be directed to second electron detection device 190. Second electron detection device 190 may produce images of one or more beam spots of the secondary electron beams on the surface of the detection device. These images of beam spots may then be used to determine the alignment characteristics of the secondary electron beams associated with the first electron detection device 140, which may be influenced by the alignments of secondary projection system 150 itself or the alignments of the secondary electron beams with respect to secondary projection system 150.

In some embodiments, controller 50 may include signal processing circuitry to perform the beam boundary determination and beam intensity determination in real-time based on the beam spot images generated by second electron detection device 190 during the alignment mode. The high-speed real-time processor can provide information about how secondary projection system 150 and beam separator 133 are performing in real-time so that any performance deviation (for example, shape and position of each beam, geometric formation of the electron beam grids, unexpected movements of part or all of the beams due to the imperfection of components manufacturing and assembling, drift during long term operation) can be detected and addressed. In some embodiments, controller 50 may automatically adjust a configuration of secondary projection system 150 to calibrate images of secondary electron beams 161, 162, and 163.

In some embodiments, controller 50 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 108. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 140. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 108. The acquired images may comprise multiple images of a single imaging area of sample 108 sampled multiple times over a time sequence. The multiple images may be stored in the storage. In some embodiments, controller 50 may be configured to perform image processing steps with the multiple images of the same location of sample 108.

In some embodiments, controller 50 may include measurement circuitries (e.g., analog-to-digital converters) to obtain a distribution of the detected secondary electrons. The electron distribution data collected during a detection time window, in combination with corresponding scan path data of primary electron beam 102 incident on the wafer surface, can be used to reconstruct images of the wafer structures under inspection. The reconstructed images can be used to reveal various features of the internal or external structures of sample 108, and thereby can be used to reveal any defects that may exist in the wafer.

Although FIG. 1B shows that apparatus 40 uses three primary electron beams, it is appreciated that apparatus 40 may use any number of primary electron beams. The present disclosure does not limit the number of primary electron beams used in apparatus 40.

Figure 2:
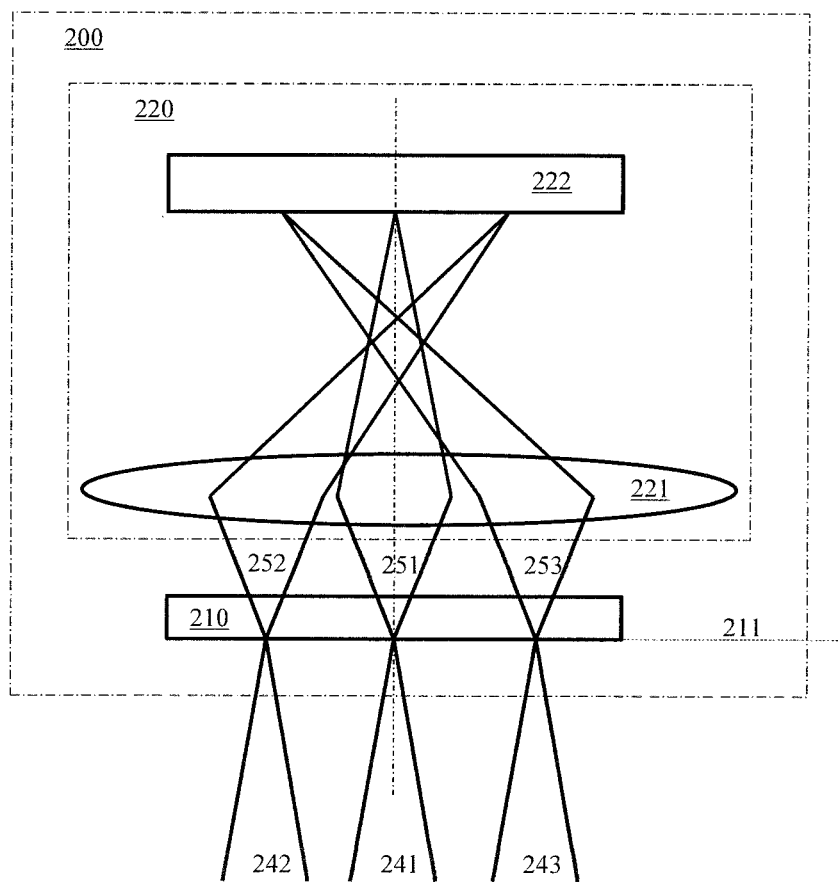
FIG. 2 is a schematic diagram illustrating an exemplary electron imaging device using an electron-to-light converter, consistent with embodiments of the present disclosure.

Reference is now made to FIG. 2, which is a schematic diagram illustrating an exemplary electron imaging device 200 with an electron-to-light converter, consistent with embodiments of the present disclosure. Electron imaging device 200 may comprise an electron-to-light converter 210 and an optical imaging device, such as an optical camera 220, among others. Electron-to-light converter 210 may convert incoming electron beams 241, 242, and 243, to light beams 251, 252, and 253. In some embodiments, electron-to-light converter 210 may comprise a scintillator, or any other device or materials that are suitable for converting electrons to photons. When struck by incoming electron beams 241, 242, and 243, electron-to-light converter 210 absorbs the energy of the electron beams and re-emits the absorbed energy in the form of photons (e.g., light beams 251, 252, and 253).

Optical camera 220 may comprise an optical lens 221 and an image sensor 222. Optical lens 221 may focus light beams 251, 252, and 253 onto the surface of image sensor 222. When it receives the focused light beams 251, 252, and 253, image sensor 222 may generate corresponding electrical signals. In some embodiments, an image processing system (such as controller 50 of FIG. 1B) may produce images of electron beams 241, 242, and 243 based on the electrical signals generated by image sensor 222. In some embodiments, image sensor 222 may comprise a charge-coupled device (CCD) sensor, a complementary metal-oxide-semiconductor (CMOS) sensor, or any other device suitable to generate electrical signals in response to incoming lights.

In some embodiments, electron imaging device 200 may be used as electron image viewer for alignment, such as second electron detection device 190 in FIG. 1B.

Reference is now made to FIGS. 3A, 3B, 3C, and 3D, which are schematic diagrams illustrating an exemplary multi-beam electron beam tool, consistent with embodiments of the present disclosure. In some embodiments, a multi-beam electron beam tool (such as electron beam tool 40 in FIG. 1B) may include a secondary projection system 150 (similar to secondary projection system 150 in FIG. 1B), a first electron detection device 140 (similar to first electron detection device 140 in FIG. 1B), and a movable second electron detection device 301 (similar to second electron detection device 190 in FIG. 1B). In some embodiments, movable second electron detection device 301 may be configured to move relative to first electron detection device 140 in a direction which, in some embodiments, may be substantially perpendicular to secondary optical axis 151. In some embodiments, the detection surface of first electron detection device 140 and the detection surface of movable second electron detection device 301 may be parallel.

Figure 3A:
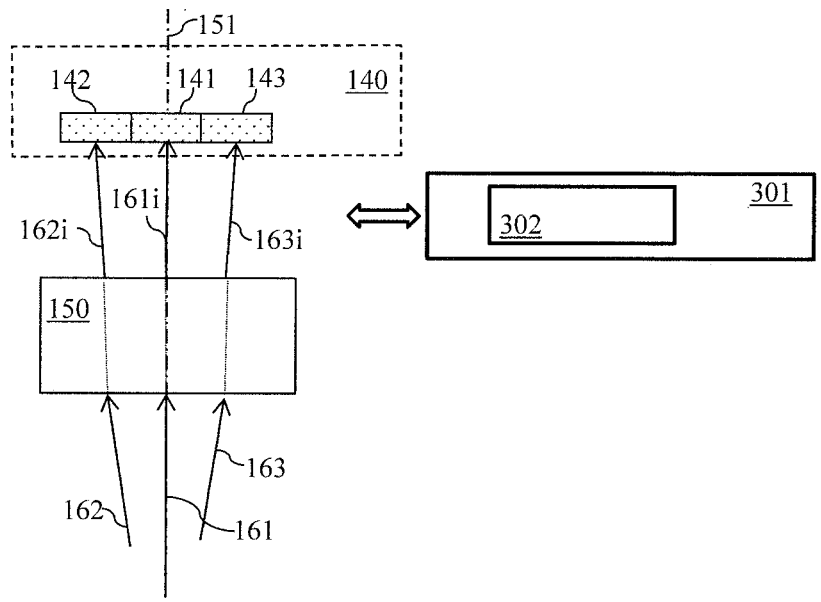
FIGS. 3A, 3B, 3C, and 3D are schematic diagrams illustrating an exemplary multi-beam electron beam tool, consistent with embodiments of the present disclosure.

FIG. 3A shows the multi-beam electron beam tool during the inspection mode. When the tool is in the inspection mode, movable second electron detection device 301 may be moved out of the paths of secondary electron beams 161i, 162i, and 163i (as shown in more details in FIG. 3C and FIG. 3D, focused onto detection surface 144 of first electron detection device 140), and therefore allow first electron detection device 140 to receive secondary electron beams 161i, 162i, and 163i for inspection.

Figure 3B:
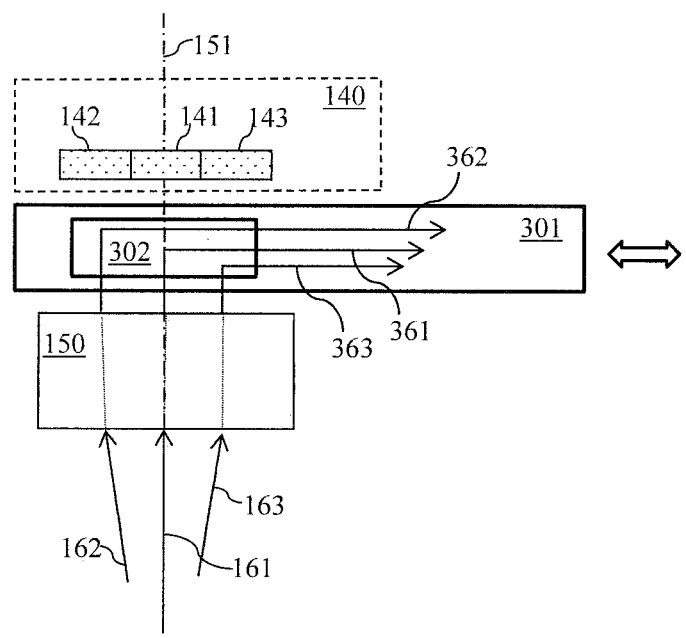

FIG. 3B shows the multi-beam electron beam tool during the alignment mode. When the tool is in the alignment mode, movable second electron detection device 301 may be moved in and positioned between secondary projection system 150 and first electron detection device 140, and therefore intercept secondary electron beams 161, 162, and 163 (as shown in more details in FIG. 3C and FIG. 3D, focused onto detection surface 311 of movable second electron detection device 310 or 340). In some embodiments, movable second electron detection device 301 may convert the intercepted secondary electron beams to light beams 361, 362, and 363.

Figure 3C:
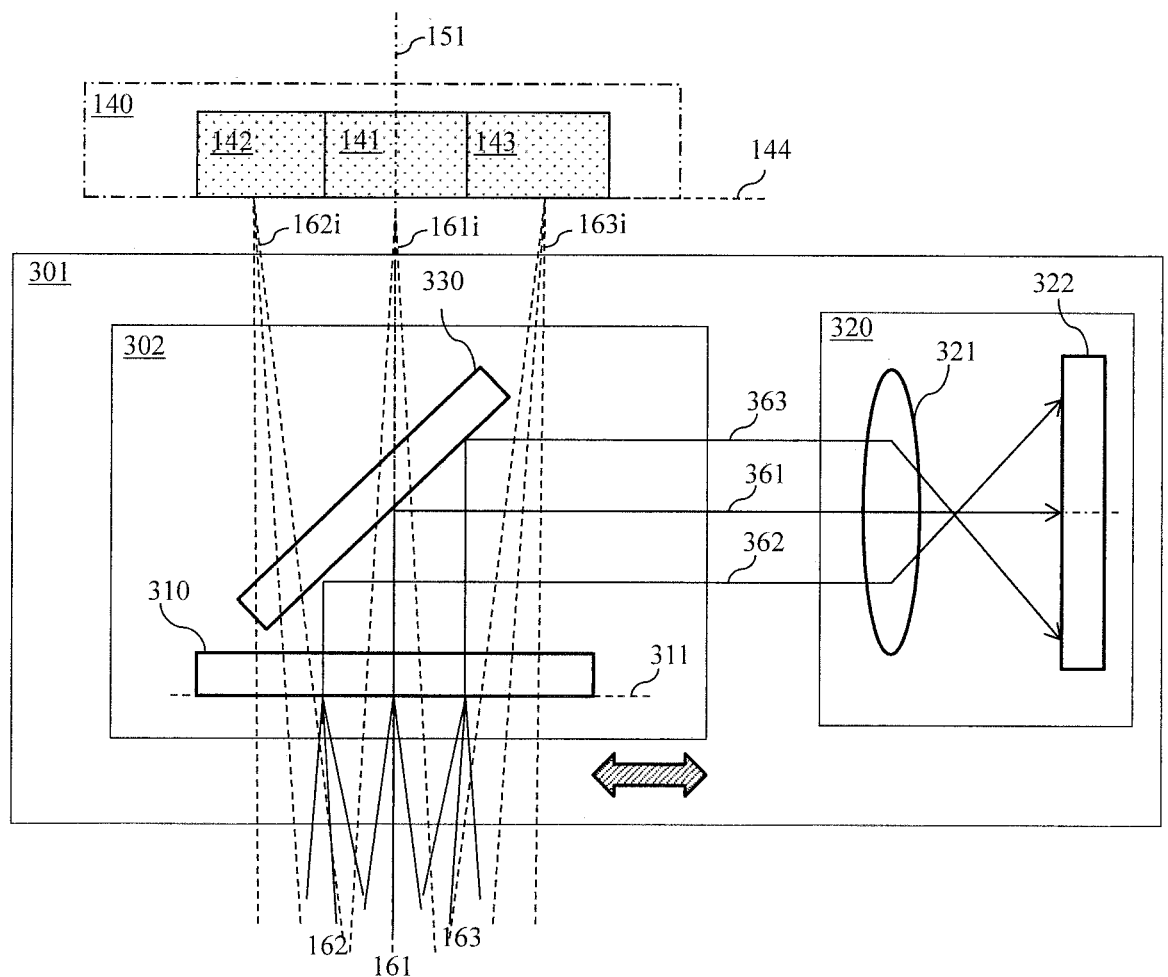

In some embodiments, movable second electron detection device 301 may comprise an electron imaging device using an electron-to-light converter (such as electron imaging device 200 shown in FIG. 2). FIG. 3C shows the internal schematic of an exemplary movable second electron detection device 301. In such embodiments, movable second electron detection device 301 may comprise a movable conversion-directing device 302 and an optical camera 320.

Movable conversion-directing device 302 may comprise an electron-to-light converter 310 and a mirror 330. Electron-to-light converter 310 may convert incoming secondary electron beams 161, 162, and 163, to light beams 361, 362, and 363. As explained with regard to FIG. 2 above, in some embodiments, electron-to-light converter 310 may comprise a scintillator, or any other device or materials that are suitable for converting electron to photons.

In such embodiments, movable conversion-directing device 302 may be configured to move relative to first electron detection device 140 in a direction which, in some embodiments, may be substantially perpendicular to secondary optical axis 151. In such embodiments, during the inspection mode, movable conversion-directing device 302 may be moved out of the paths of secondary electron beams 161, 162, and 163, and therefore allow first electron detection device 140 to receive secondary electron beams 161i, 162i, and 163i for inspection. During the alignment mode, movable conversion-directing device 302 may be moved in and positioned between secondary projection system (not shown in FIG. 3C) and first electron detection device 140 to intercept secondary electron beams 161, 162, and 163. When receiving electron beams, movable conversion-directing device 302 may convert the electron beams to light beams 361, 362, and 363, and then direct those light beams towards optical camera 320 with mirror 330.

In some embodiments, only movable conversion-directing device 302 may be configured to move. In other embodiments, movable second electron detection device 301, which includes a conversion-directing device, may be configured to move relative to first electron detection device 140.

In some embodiments, optical camera 320 may comprise an optical lens 321 and an image sensor 322. Optical lens 321 may focus the directed light beams 361, 362, and 363 onto the surface of image sensor 322. When receiving the focused light beams 361, 362, and 363, image sensor 322 may generate corresponding electrical signals. In some embodiments, an image processing system (such as one in controller 50 of FIG. 1B) may process the electric signals and produce images of electron beams 161, 162, and 163 based on the electrical signals from image sensor 322. In some embodiments, image sensor 322 may comprise a charge-coupled device (CCD) sensor, a complementary metal-oxide-semiconductor (CMOS) sensor, or any other device suitable to generate electrical signals in response to incoming lights.

In some embodiments, movable second electron detection device 301 may not include mirror 330. Instead, optical camera 320 may be placed in line with electron-to-light converter 310 (like electron imaging device 200 shown in FIG. 2). However, as shown in FIG. 3C, using mirror 330 may allow electron-to-light converter 310 to be placed closer to first electron detection device 140 during alignment mode, so that images of secondary electron beam spots captured during the alignment mode may closely represent the alignment characteristics of secondary electron beams 161, 162, and 163 in association with first electron detection device 140.

Figure 3D:
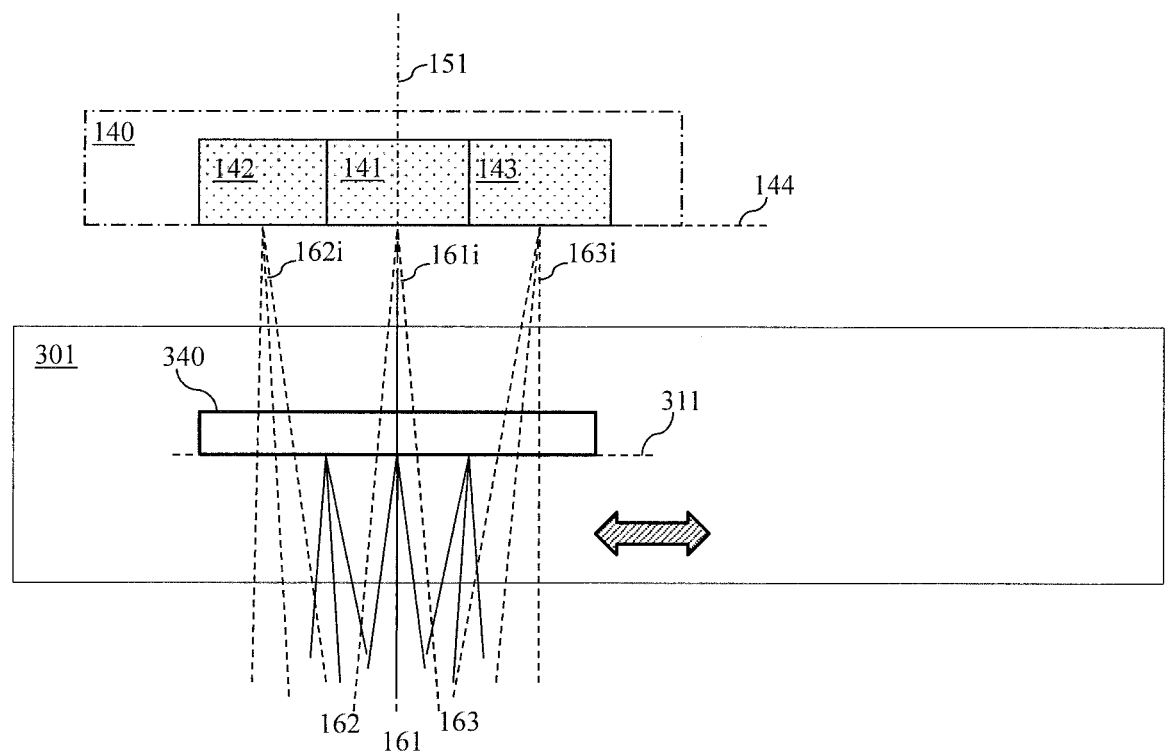

In some embodiments, as shown in FIG. 3D, movable second electron detection device 301 may include a direct detection device (DDD) 340. During the alignment mode, direct detection device 340 may detect directly secondary electron beams 161, 162, and 163, and therefore electron-to-light conversion step may be omitted. During the inspection mode, direct detection device 340 may be moved out of the paths of secondary electron beams 161, 162, and 163, and therefore allow first electron detection device 140 to receive secondary electron beams 161*i*, 162*i*, and 163*i* for inspection. Direct detection device 340, in some embodiments, may include one or more CMOS sensors configured to directly detect secondary electron beams and generate a corresponding electric signal.

Reference is now made to FIGS. 4A, 4B, 4C, and 4D, which are schematic diagrams illustrating an exemplary multi-beam electron beam tool, consistent with embodiments of the present disclosure. In some embodiments, a multi-beam electron beam tool (such as electron beam tool 40 in FIG. 1B) may include a secondary projection system 150 (similar to secondary projection system 150 in FIG. 1B), a movable first electron detection device 140 (similar to first electron detection device 140 in FIG. 1B), and a second electron detection device 401 (similar to second electron detection device 190 in FIG. 1B). In such embodiments, movable first electron detection device 140 may be configured to move relative to second electron detection device 401 in a direction which, in some embodiments, may be substantially perpendicular to secondary optical axis 151. In some embodiments, the detection surface of movable first electron detection device 140 and the detection surface of second electron detection device 401 may be parallel.

Figure 4A:
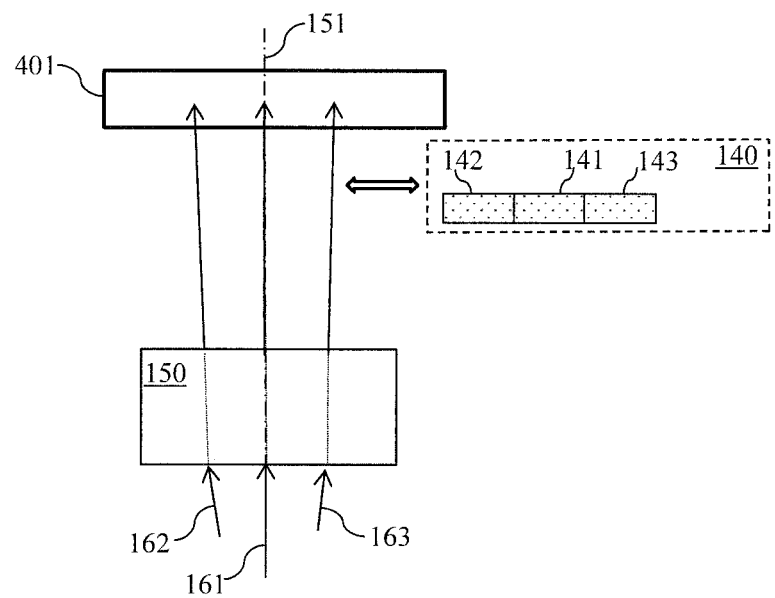
FIGS. 4A, 4B, 4C, and 4D are schematic diagrams illustrating an exemplary multi-beam electron beam tool, consistent with embodiments of the present disclosure.

FIG. 4A shows the multi-beam electron beam tool during the alignment mode. When the tool is in the alignment mode, movable first electron detection device 140 may be moved out of the paths of secondary electron beams 161, 162, and 163, and therefore allow second electron detection device 401 to receive secondary electron beams 161*a*, 162*a*, and 163*a* (as shown in more details in FIG. 4C and FIG. 4D, focused onto detection surface 411 of second electron detection device 410 or 440) for alignment.

Figure 4B:
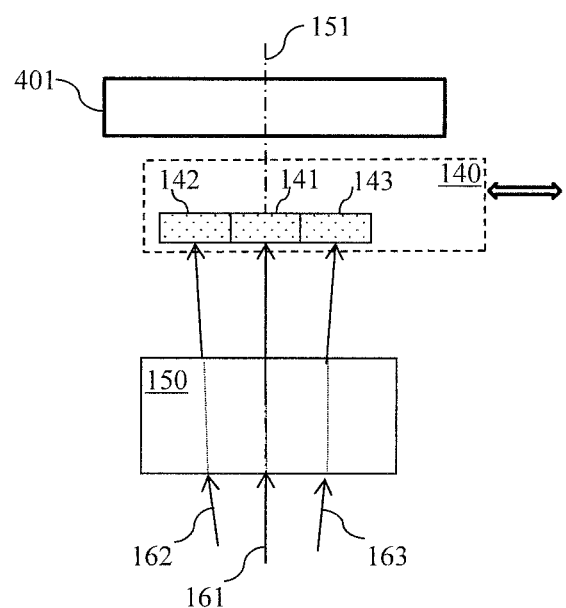

FIG. 4B shows the multi-beam electron beam tool during the inspection mode. When the tool is in the inspection module, movable first electron detection device 140 may be moved in and positioned between secondary projection system 150 and second electron detection device 401, and therefore movable first electron detection device 140 receives secondary electron beams 161, 162, and 163 (as shown in more details in FIG. 4C and FIG. 4D, focused onto detection surface 144 of movable first electron detection device 140) for inspection.

Figure 4C:
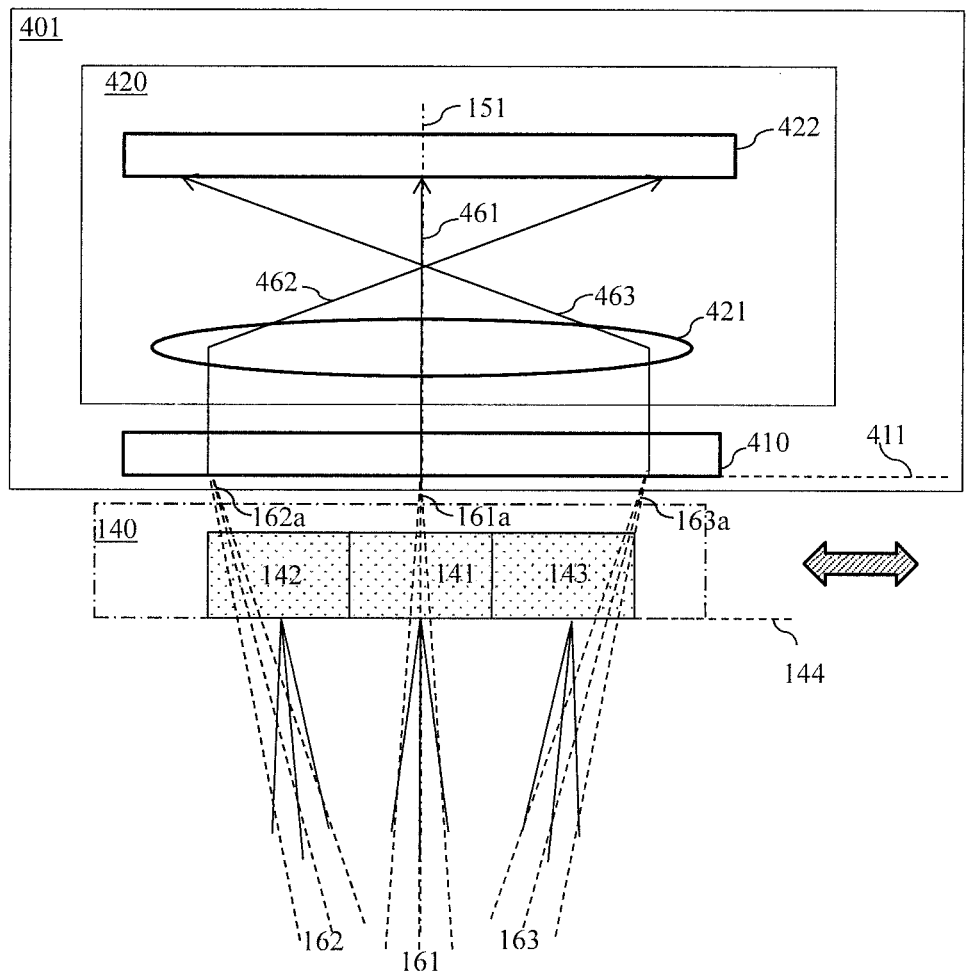

FIG. 4C shows second electron detection device 401 comprising an electron-to-light converter-based imaging device (such as electron imaging device 200 in FIG. 2). In some embodiments, second electron detection device 401 may comprise an electron-to-light converter 410 and an optical camera 420. Electron-to-light converter 410 may convert incoming secondary electron beams 161, 162, and 163 to light beams 461, 462, and 463. Optical camera 420 may comprise an optical lens 421 and an image sensor 422. Image sensor 422 may detect light beams 461, 462, and 463. As described with regard to FIG. 3C, second electron detection device 401 may detect incoming secondary electron beams 161, 162, and 163 and generate electrical signals to produce one or more images of beam spots of the incoming secondary electron beams 161, 162, and 163. Although FIG. 4C shows second electron detection device 401 without a mirror, a second electron detection device with a mirror (such as movable second electron detection device 301 in FIG. 3C) may also be used in such embodiments.

Figure 4D:
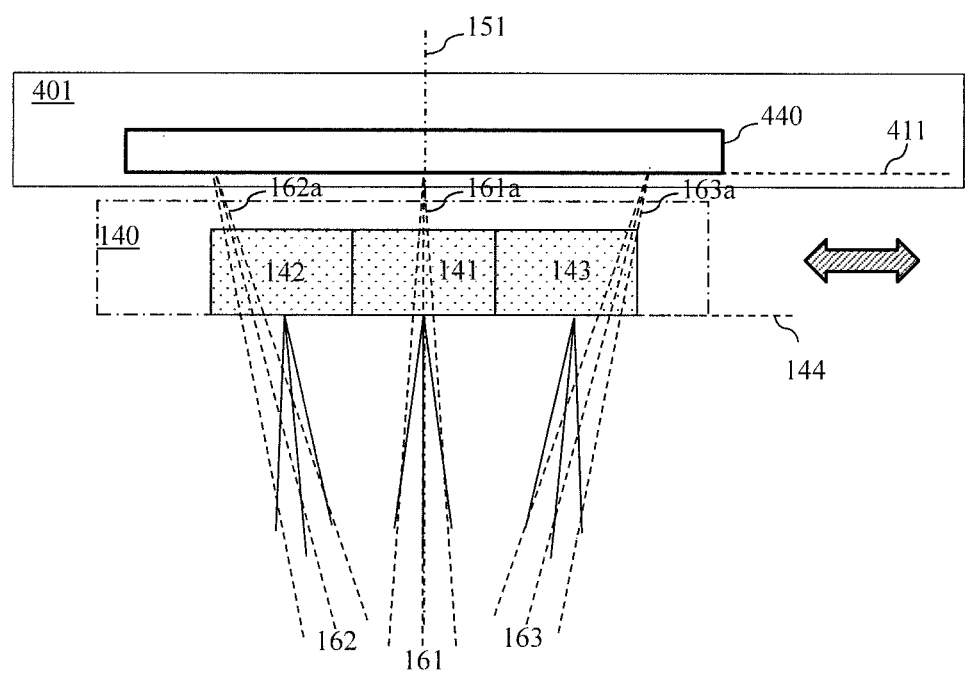

FIG. 4D shows second electron detection device 401 comprising a direct detection device (DDD) 440. Direct detection device 440 may detect directly secondary electron beams 161, 162, and 163, and therefore electron-to-light conversion step may be omitted. Direct detection device 440, in some embodiments, may include one or more CMOS sensors configured to directly detect secondary electron beams and generate a corresponding electric signal.

Figure 5A:
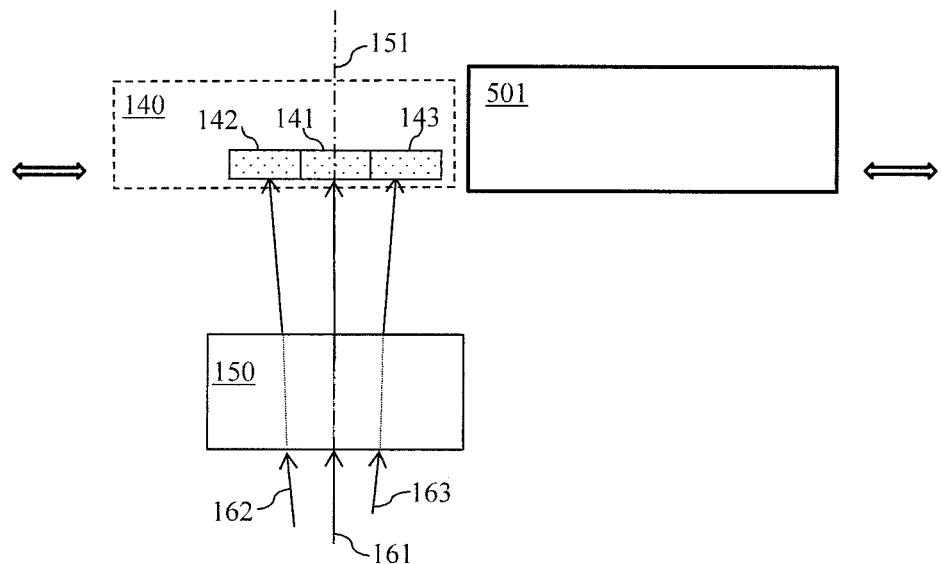
FIGS. 5A, 5B, 5C, and 5D are schematic diagrams illustrating an exemplary multi-beam electron beam tool, consistent with embodiments of the present disclosure.
Figure 5B:
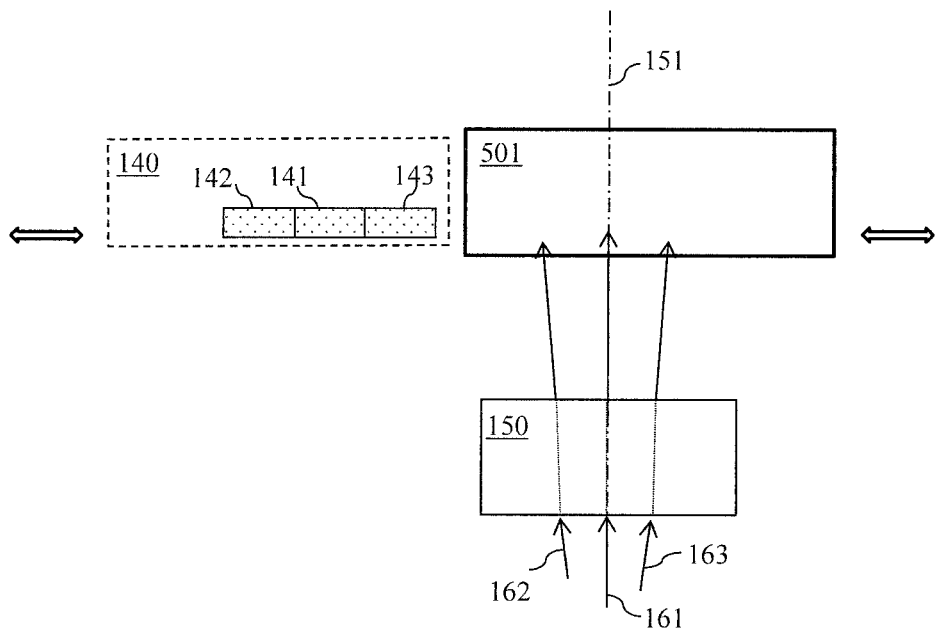

Reference is now made to FIGS. 5A, and 5B, which are schematic diagrams illustrating an exemplary multi-beam electron beam tool, consistent with embodiments of the present disclosure. In some embodiments, a multi-beam electron beam tool may comprise a movable first electron detection device 140 and a movable second electron detection device 501 positioned side-by-side. In such embodiments, first electron detection device 140 and second electron detection device 501 may be configured to move together in a direction which, in some embodiments, may be substantially perpendicular to secondary optical axis 151. In such embodiments, during the inspection mode (as shown in FIG. 5A), both electron detection devices may move in a first direction (e.g., to the right in FIG. 5A) so that first electron detection device 140 may be positioned to receive secondary electron beams 161, 162, and 163. During the alignment mode (as shown in FIG. 5B), both electron detection devices may move in a second direction (e.g., to the left in FIG. 5B) so that second electron detection device 501 may receive secondary electron beams 161, 162, and 163. In some embodiments, the detection surface of first electron detection device 140 and the detection surface of second electron detection device 501 may be parallel.

As explained with regard to previous embodiments above, in some embodiments, second electron detection device 501 may comprise an electron-to-light converter-based imaging device (such as second electron detection device 301 in FIG. 3C or second electron detection device 401 in FIG. 4C). In some embodiments, second electron detection device 501 may comprise a direct detection device (such as second electron detection device 301 in FIG. 3D or second electron detection device 401 in FIG. 4D).

Figure 5C:
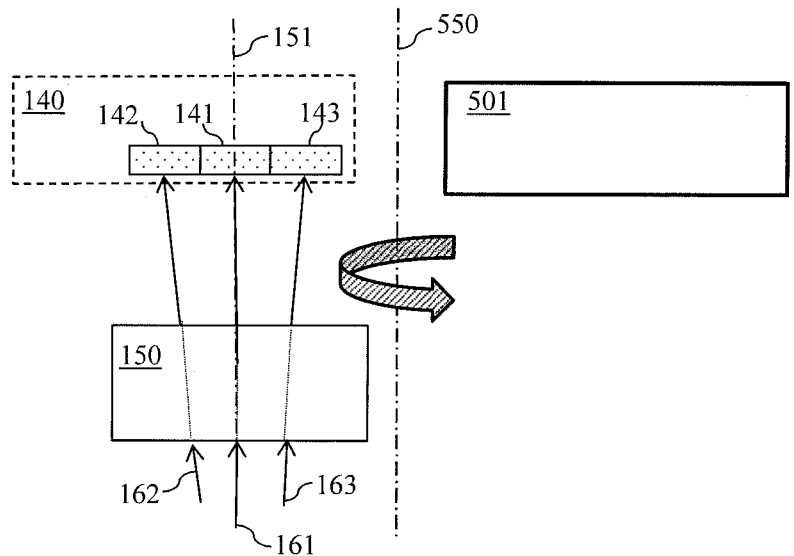
Figure 5D:
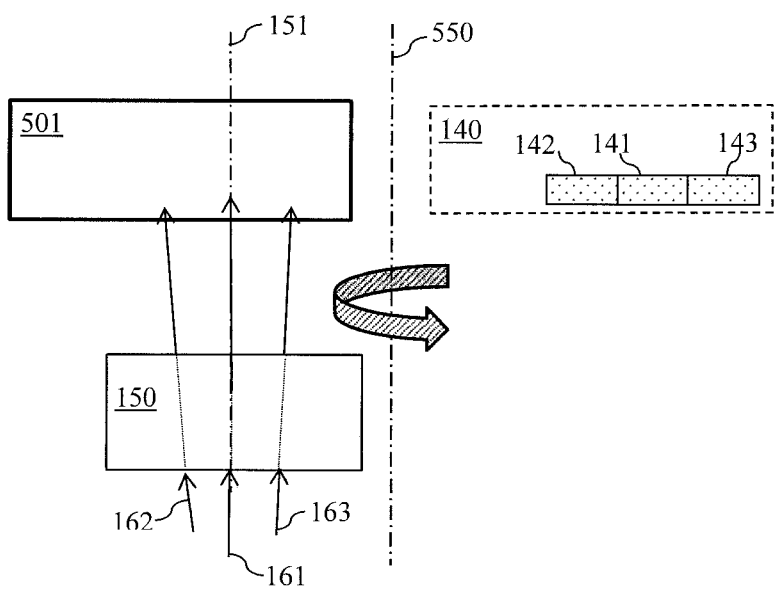

Reference is now made to FIGS. 5C, and 5D, which are schematic diagrams illustrating an exemplary multi-beam electron beam tool, consistent with embodiments of the present disclosure. In some embodiments, a multi-beam electron beam tool may comprise a rotatable first electron detection device 140 and a rotatable second electron detection device 501 positioned side-by-side. In such embodiments, first electron detection device 140 and second electron detection device 501 may be configured to rotate together around a rotation axis 550 clockwise or counter-clockwise to align rotatable first electron detection device 140 or rotatable second electron detection device 501 to detect secondary electron beams during the inspection mode or the alignment mode, respectively. In such embodiments, during the inspection mode (as shown in FIG. 5C), both electron detection devices may rotate so that first electron detection device 140 is positioned to receive secondary electron beams 161, 162, and 163 for inspection. During the alignment mode (as shown in FIG. 5D), both electron detection devices may rotate 180-degree from the positions in the inspection mode so that second electron detection device 501 receives secondary electron beams 161, 162, and 163. In some embodiments, the detection surface of first electron detection device 140 and the detection surface of second electron detection device 501 may be parallel.

As explained with regard to previous embodiments above, in some embodiments, second electron detection device 501 may comprise an electron-to-light converter-based imaging device (such as movable second electron detection device 301 in FIG. 3C or second electron detection device 401 in FIG. 4C). In some embodiments, second electron detection device 501 may comprise a direct detection device (such as movable second electron detection device 301 in FIG. 3D or second electron detection device 401 in FIG. 4D).

Figure 6A:
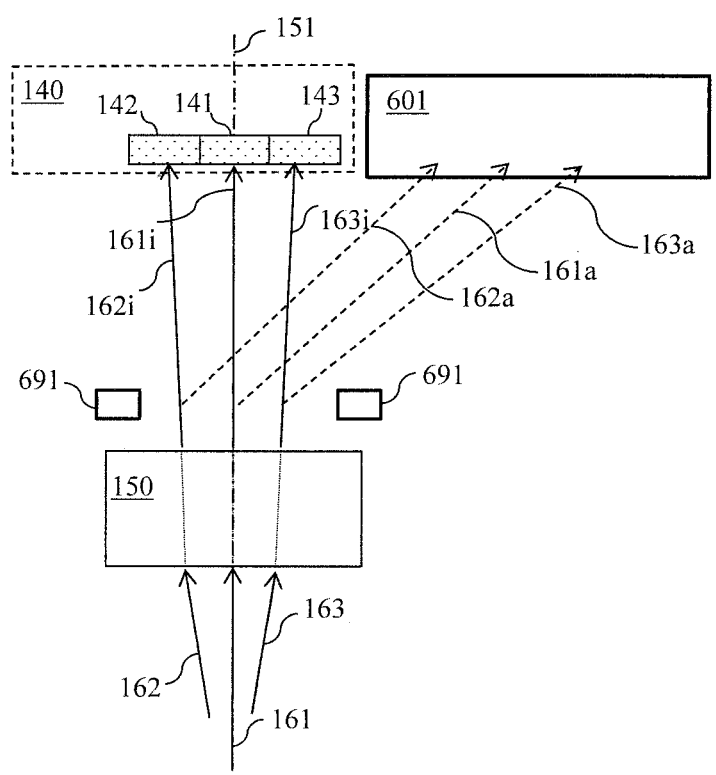
FIGS. 6A, 6B, and 6C are schematic diagrams illustrating an exemplary multi-beam electron beam tool, consistent with embodiments of the present disclosure.
Figure 6B:
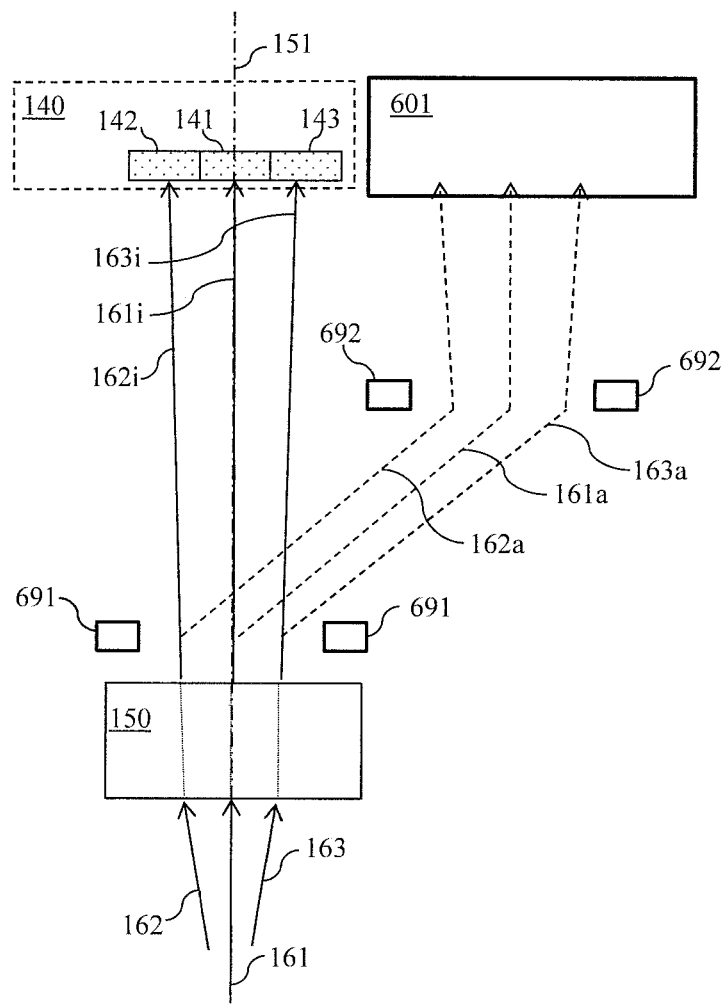
Figure 6C:
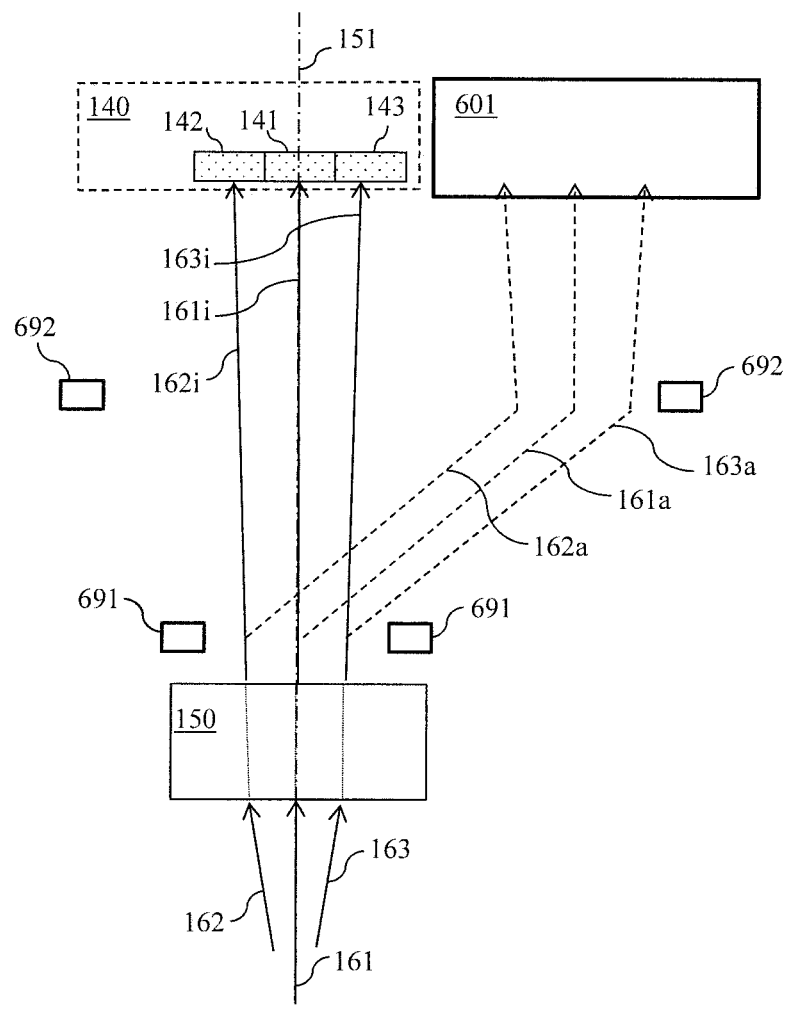

Reference is now made to FIGS. 6A, 6B, and 6C, which are schematic diagrams illustrating an exemplary multi-beam electron beam tool, consistent with embodiments of the present disclosure. In some embodiments, a multi-beam electron beam tool may comprise a first electron detection device 140 and a second electron detection device 601 positioned side-by-side as shown in FIG. 6A. In such embodiments, a deflector 691 may be used to direct secondary electron beams 161, 162, and 163 towards second electron detection device 601 during the alignment mode as shown as secondary electron beams 161a, 162a, and 163a. On the other hand, during the inspection mode, deflector 691 may be disabled so that secondary electron beams 161, 162, and 163 may travel straight to first electron detection device 140 for inspection as shown as secondary electron beams 161i, 162i, and 163i. In some embodiments, the detection surface of first electron detection device 140 and the detection surface of second electron detection device 601 may be parallel.

In some embodiments, more than one deflector may be used to change the direction of the secondary electron beams during the alignment mode. For example, as shown in FIG. 6B and FIG. 6C, a multi-beam electron beam tool may comprise a first deflector (deflector 691) and a second deflector (deflector 692). During the alignment mode, first deflector 691 may be enabled to direct secondary electron beams 161, 162, and 163 towards second electron detection device 601, as shown as secondary electron beams 161a, 162a, and 163a, and second deflector 692 may be also enabled to compensate the deflection aberrations caused by first deflector 691 so that second electron detection device 601 can detect secondary electron beams 161a, 162a, and 163a with low aberrations. In some embodiments, the detection surface of first electron detection device 140 and the detection surface of second electron detection device 601 may be parallel.

The position of second deflector 692 may be flexible. In some embodiments, first electron detection device 140 and a second electron detection device 601 may be located close to each other, which provides higher resemblance between images captured during the inspection mode and images captured during the alignment mode. In such a case, the second electron beam paths during the inspection mode and the alignment mode may be substantially close each other. As a result, there may be no room to place second deflector 692 between the two sets of paths. In such a case, as shown in FIG. 6C, second deflector 692 may be positioned further away to enclose the both sets of beam paths, so that first electron detection device 140 and a second electron detection device 601 can be located substantially close to each other.

As explained with regard to previous embodiments above, in some embodiments, second electron detection device 601 may comprise an electron-to-light converter-based imaging device (such as movable second electron detection device 301 in FIG. 3C or second electron detection device 401 in FIG. 4C). In some embodiments, second electron detection device 601 may comprise a direct detection device (such as movable second electron detection device 301 in FIG. 3D or second electron detection device 401 in FIG. 4D).

Figure 7:
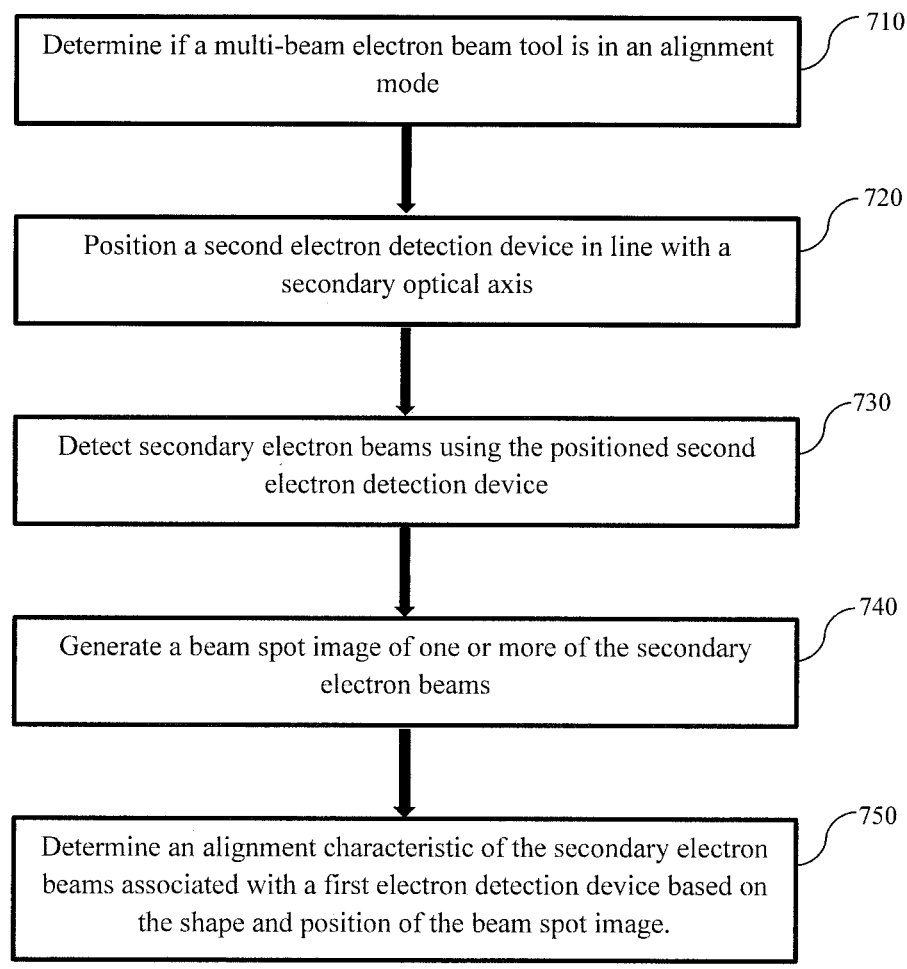
FIG. 7 is a flow chart illustrating steps of an exemplary alignment operation using an embodiment of the multi-beam electron beam tool, consistent with embodiments of the present disclosure.

Reference is now made to FIG. 7, which is a flow chart illustrating steps of an exemplary alignment operation using an embodiment of the electron beam tool, consistent with embodiments of the present disclosure. The method may be performed by a multi-beam electron beam tool (such as electron beam tool 40 of FIG. 1B).

In step 710, the multi-beam electron beam tool determines if an alignment mode is enabled. In some embodiments, the multi-beam electron beam tool may implement two different operating modes, such as an inspection mode and an alignment mode. During the inspection mode, a first electron detection device (such as electron detection device 140 of FIGS. 3A and 3B) may receive secondary electron beams (such as secondary electron beams 161, 162, and 163 shown in FIGS. 3A and 3B) for inspection. During the alignment mode, a second electron detection device (such as movable second electron detection device 301 of FIGS. 3A and 3B) may receive the secondary electron beams. The second electron detection device may be used to examine the shapes and positions of secondary electron beam spots and determine alignment characteristics of secondary electron beams, e.g., whether misalignments exist in the secondary electron projection path and by how much. The misalignments, which may degrade the quality of produced images of sample, may be caused by multiple reasons. For example, a beam separator (such as beam separator 133 in FIG. 1B) may deflect the secondary electron beams in inaccurate angles. Also, a secondary projection system (secondary projection system 150 in FIGS. 1B, 3A, and 3B) may be improperly aligned with a secondary optical axis (such as secondary optical axis 151 in FIGS. 1B, 3A, and 3B). Furthermore, the electron detection device may be improperly aligned with the secondary optical axis. When these misalignments exist, secondary electron beams may suffer unwanted aberrations, magnification errors, or rotation angle errors, thereby resulting in malformed shapes, positions, or excessive enlargements or beam spots, which in turn may cause overlaps and cross-talk between adjacent beams.

In step 720, the multi-beam electron beam tool positions the second electron detection device in line with the secondary optical axis so that the second electron detection device may receive the secondary electron beams, instead of the first electron detection device.

In step 730, the multi-beam electron beam tool detects the received secondary electron beams using the second electron detection device, which generates corresponding electrical image signals in response to the detected secondary electron beams.

In step 740, the multi-beam electron beam tool generates one or more of beam spot images of the secondary electron beams based on the electrical image signal outputted by second electron detection device. In some embodiments, the second electron detection device is connected to a controller (such as controller 50 in FIG. 1B), which may comprise an image processing system that is configured to generate the beam spot images of the secondary electron beams based on the image signals from the second electron detection device.

In step 750, the multi-beam electron beam tool determines the alignment characteristics of secondary electron beams associated with the first electron detection device. In some embodiments, this determination may be automatically performed by the multi-beam electron beam tool (e.g., by the controller). In other embodiments, this determination may be performed manually by an operator of the multi-beam electron beam tool.

The embodiments may further be described using the following clauses:

1. A charged particle beam apparatus for inspecting a wafer, comprising:
    a first electron detection device to detect a plurality of secondary electron beams for inspection of the wafer; and
    a second electron detection device to generate one or more images of one or more beam spots of the plurality of secondary electron beams, wherein the second electron detection device is configured to be used to determine an alignment characteristic associated with the first electron detection device.
2. The apparatus of clause 1, wherein the alignment characteristic associated with the first electron detection device comprises a characteristic of one or more of the plurality of secondary electron beams related to alignment of the one or more of the plurality of secondary electron beams with the first electron detection device.
3. The apparatus of any one of clauses 1 and 2, further comprising a secondary projection system to project the plurality of secondary electron beams onto a detection surface of the first electron detection device or a detection surface of the second electron detection device.
4. The apparatus of clause 3, wherein the secondary projection system is aligned with a secondary optical axis.
5. The apparatus of clause 4, wherein the secondary projection system projects the plurality of secondary electron beams onto the detection surface of the first electron detection device in an inspection mode and onto the detection surface of the second electron detection device in an alignment mode.
6. The apparatus of any one of clauses 1 to 5, further comprising a controller including circuitry to determine, based on the one or more images of the one or more beam spots of the plurality of secondary electron beams, the alignment characteristic associated with the first electron detection device.
7. The apparatus of clause 6, wherein the controller includes circuitry to provide a user interface for a user to adjust a configuration of the secondary projection system to calibrate alignment of the one or more of the plurality of secondary electron beams with the first electron detection device, based on the determined alignment characteristic.
8. The apparatus of clause 6, wherein the controller includes circuitry to automatically adjust a configuration of the secondary projection system to calibrate alignment of the one or more of the plurality of secondary electron beams with the first electron detection device, based on the determined alignment characteristic.
9. The apparatus of any one of clauses 1 to 8, wherein the alignment characteristic comprises a focus quality of the one or more beam spots of the plurality of secondary electron beams.
10. The apparatus of any one of clauses 1 to 9, wherein the second electron detection device comprises:
    an electron-to-light conversion unit configured to convert the plurality of secondary electron beams to a plurality of light beams, and
    an optical camera to produce the one or more images of the one or more beam spots of the plurality of secondary electron beams based on the plurality of light beams.
11. The apparatus of clause 10, wherein the second electron detection device further comprises a mirror to direct the plurality of light beams to the optical camera.
12. The apparatus of any one of clauses 10 and 11, wherein the electron-to-light conversion unit includes a scintillator.
13. The apparatus of any one of clauses 10 to 12, wherein the optical camera includes a charge-coupled device (CCD) sensor or a complementary metal-oxide-semiconductor (CMOS) sensor.
14. The apparatus of any one of clauses 1 to 9, wherein the second electron detection device comprises a direct detection device (DDD) to produce the one or more images of the one or more beam spots of the plurality of secondary electron beams.
15. The apparatus of clause 14, wherein the direct detection device includes a CMOS sensor configured to directly detect the plurality of secondary electron beams and to generate a corresponding electric signal.
16. The apparatus of any one of clauses 1 to 15, wherein the second electron detection device is configured to move relative to the first electron detection device.
17. The apparatus of clause 16, wherein the second electron detection device is further configured to:
    move in a first direction, in preparation for the alignment mode, so that the second electron detection device receives the plurality of secondary electron beams, and
    move in a second direction, in preparation for the inspection mode, so that the first electron detection device receives the plurality of secondary electron beams.
18. The apparatus of any one of clauses 1 to 15, wherein the first electron detection device is configured to move relative to the second electron detection device.
19. The apparatus of clause 18, wherein the first electron detection device is further configured to:
    move in a first direction, in preparation for the inspection mode, so that the first electron detection device receives the plurality of secondary electron beams, and
    move in a second direction, in preparation for the alignment mode, so that the second electron detection device receives the plurality of secondary electron beams.
20. The apparatus of any one of clauses 1 to 15, wherein the first electron detection device and the second electron detection device are positioned side-by-side and are configured to move together.
21. The apparatus of any one of clauses 1 to 15, wherein the first electron detection device and the second electron detection device are positioned relative to a rotation axis and are configured to rotate around the rotation axis together for switching between an inspection mode and an alignment mode.
22. The apparatus of any one of clauses 20 and 21, wherein the first electron detection device is configured to receive the plurality of secondary electron beams in an inspection mode, and the second electron detection device is configured to receive the plurality of secondary electron beams in an alignment mode.
23. The apparatus of any one of clauses 1 to 15, further comprising a deflector to direct the plurality of secondary electron beams to the second electron detection device in an alignment mode.

24. The apparatus of any one of clauses 1 to 23, wherein the detection surface of the first electron detection device is substantially located on a first plane and the detection surface of the second electron detection device is substantially located on a second plane, and the first plane and the second plane are parallel.

25. A method of inspecting a wafer using a charged particle beam system with a secondary projection system to project a plurality of secondary electron beams onto a detection surface of a first electron detection device, the method comprising:
  generating one or more images of one or more beam spots of the plurality of secondary electron beams using a second electron detection device; and
  determining an alignment characteristic associated with the first electron detection device based on the one or more images of the one or more beam spots of the plurality of secondary electron beams.

26. The method of clause 25, further comprising determining, using a controller, the determined alignment characteristic associated with the first electron detection device based on the one or more images of the one or more beam spots of secondary electron beams.

27. The method of clause 26, further comprising providing, using the controller, a user interface for a user to adjust configurations of the secondary projection system to calibrate alignment of the one or more of the plurality of secondary electron beams with the first electron detection device, based on the determined alignment characteristic.

28. The method of clause 26, further comprising automatically adjusting, using the controller, configurations of the secondary projection system to calibrate alignment of the one or more of the plurality of secondary electron beams associated with the first electron detection device, based on the determined alignment characteristic.

29. The method of any one of clauses 25 to 28, wherein the alignment characteristic comprises a focus quality of the one or more beam spots of the plurality of secondary electron beams.

30. The method of any one of clauses 29, wherein automatically adjusting comprises adjusting the configurations of the secondary projection system to calibrate the focus quality of the one or more beam spots of the plurality of secondary electron beams.

31. The method of any clauses 25 to 30, further comprising moving the second electron detection device relative to the first electron detection device to enable the second electron detection device to receive the plurality of secondary electron beams during an alignment mode, and to enable the first electron detection device to receive the plurality of secondary electron beams during an inspection mode.

32. The method of any clauses 25 to 30, further comprising moving the first electron detection device relative to the second electron detection device to enable the second electron detection device to receive the plurality of secondary electron beams during an alignment mode, and to enable the first electron detection device to receive the plurality of secondary electron beams during an inspection mode.

33. The method of any clauses 25 to 30, further comprising moving the first electron detection device and the second electron detection device together to enable the second electron detection device to receive the plurality of secondary electron beams during an alignment mode, and to enable the first electron detection device to receive the plurality of secondary electron beams during an inspection mode.

34. The method of any clauses 25 to 30, further comprising rotating the first electron detection device and the second electron detection device together around a rotation axis to enable the second electron detection device to receive the plurality of secondary electron beams during an alignment mode, and to enable the first electron detection device to receive the plurality of secondary electron beams during an inspection mode.

35. The method of any clauses 25 to 30, further comprising directing, using a deflector, the plurality of secondary electron beams to the second electron detection device in an alignment mode.

36. The method of any one of clauses 25 to 35, wherein the first electron detection device is configured to receive the plurality of secondary electron beams in the inspection mode, and the second electron detection device is configured to receive the plurality of secondary electron beams in the alignment mode.

37. The method of any one of clauses 25 to 36, wherein the detection surface of the first electron detection device is substantially located on a first plane and the detection surface of the second electron detection device is substantially located on a second plane, and the first plane and the second plane are parallel.

It is appreciated that the multi-beam electron beam tool may use software to perform the functionality described above. For example, the multi-beam electron beam tool may perform image processing to generate the beam spot images of the received secondary electron beams. Also, the multi-beam electron beam tool may also perform software functions to automatically determine the alignment characteristics of secondary electron beams associated with the first electron detection device. Furthermore, the multi-beam electron beam tool may control and adjust a configuration of the secondary projection system (e.g., secondary projection system 150 of FIG. 2B) to calibrate the alignment of the secondary electron beams with respect to the first electron detection device. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, cloud storage, a FLASH-EPROM or any other flash memory, NVRAM, a cache, a register, any other memory chip or cartridge, and networked versions of the same.

Although the disclosed embodiments have been explained in relation to its preferred embodiments, it is to be understood that other modifications and variation can be made without departing from the spirit and scope of the subject matter as hereafter claimed.

The invention claimed is:

1. A charged particle beam apparatus for inspecting a wafer, comprising:
  a first electron detection device to detect a plurality of secondary electron beams for inspection of the wafer in an inspection mode; and
  a second electron detection device to generate one or more images of multiple beam spots of the plurality of secondary electron beams in an alignment mode, wherein the second electron detection device is configured to be used to determine an alignment characteristic associated with the first electron detection device based on sizes and shapes of the multiple beam spots of the plurality of secondary electron beams, and wherein the second electron detection device is configured to receive the plurality of secondary electron beams in the alignment mode by:
  moving the second electron detection device from a first position to a second position, the second electron detection device having been positioned in the first position when in the inspection mode; or
  changing a direction of the plurality of secondary electron beams.

2. The apparatus of claim 1, wherein the alignment characteristic associated with the first electron detection device comprises a characteristic of one or more of the plurality of secondary electron beams related to alignment of the one or more of the plurality of secondary electron beams with the first electron detection device.

3. The apparatus of claim 1, further comprising a secondary projection system to project the plurality of secondary electron beams onto a detection surface of the first electron detection device or a detection surface of the second electron detection device.

4. The apparatus of claim 3, wherein the secondary projection system is aligned with a secondary optical axis.

5. The apparatus of claim 4, wherein the secondary projection system projects the plurality of secondary electron beams onto the detection surface of the first electron detection device in the inspection mode and onto the detection surface of the second electron detection device in the alignment mode.

6. The apparatus of claim 1, further comprising a controller including circuitry to determine, based on the one or more images of the multiple beam spots of the plurality of secondary electron beams, the alignment characteristic associated with the first electron detection device.

7. The apparatus of claim 6, wherein the controller includes circuitry to provide a user interface for a user to adjust a configuration of the secondary projection system to calibrate alignment of the one or more of the plurality of secondary electron beams with the first electron detection device, based on the determined alignment characteristic.

8. The apparatus of claim 6, wherein the controller includes circuitry to automatically adjust a configuration of the secondary projection system to calibrate alignment of the one or more of the plurality of secondary electron beams with the first electron detection device, based on the determined alignment characteristic.

9. The apparatus of claim 1, wherein the alignment characteristic comprises a focus quality of the multiple beam spots of the plurality of secondary electron beams.

10. The apparatus of claim 1, wherein the second electron detection device comprises:
  an electron-to-light conversion unit configured to convert the plurality of secondary electron beams to a plurality of light beams, and
  an optical camera to produce the one or more images of the multiple beam spots of the plurality of secondary electron beams based on the plurality of light beams.

11. The apparatus of claim 10, wherein the second electron detection device further comprises a mirror to direct the plurality of light beams to the optical camera.

12. The apparatus of claim 10, wherein the electron-to-light conversion unit includes a scintillator.

13. The apparatus of claim 10, wherein the optical camera includes a charge-coupled device (CCD) sensor or a complementary metal-oxide-semiconductor (CMOS) sensor.

14. The apparatus of claim 1, wherein the second electron detection device comprises a direct detection device (DDD) to produce the one or more images of the multiple beam spots of the plurality of secondary electron beams.

15. A method of inspecting a wafer using a charged particle beam system with a secondary projection system to project a plurality of secondary electron beams onto a detection surface of a first electron detection device, the method comprising:
  moving a second electron detection device from a first position to a second position, the second electron detection device having been positioned in the first position when the plurality of secondary electron beams are projected onto the detection surface of the first electron detection device, or changing a direction of the plurality of secondary electron beams;
  generating one or more images of multiple beam spots of the plurality of secondary electron beams using the second electron detection device after the second electron detection device receives the plurality of secondary electron beams; and
  determining an alignment characteristic associated with the first electron detection device based on sizes and shapes of the multiple beam spots of the plurality of secondary electron beams.

* * * * *